United States Patent
Shiotani et al.

(12) 
(10) Patent No.: US 6,797,392 B2
(45) Date of Patent: Sep. 28, 2004

(54) POLYIMIDE/METAL COMPOSITE SHEET

(75) Inventors: Akinori Shiotani, Chiba (JP); Hiroaki Yamaguchi, Chiba (JP); Fumio Aoki, Chiba (JP); Katsutoshi Washio, Chiba (JP); Tatsuo Tsumiyama, Yamaguchi (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 10/454,730

(22) Filed: Jun. 3, 2003

(65) Prior Publication Data

US 2003/0211345 A1 Nov. 13, 2003

Related U.S. Application Data

(63) Continuation of application No. 09/021,074, filed on Feb. 9, 1998, now abandoned, which is a continuation-in-part of application No. 08/690,107, filed on Jul. 31, 1996, now Pat. No. 5,741,598.

(30) Foreign Application Priority Data

| Aug. 1, 1995 | (JP) | ................................................ 7-196537 |
| Aug. 1, 1995 | (JP) | ................................................ 7-196538 |
| May 31, 1996 | (JP) | ................................................ 8-138551 |
| Mar. 28, 1997 | (JP) | ................................................ 9-078572 |

(51) Int. Cl.$^7$ ............................................. B32B 15/08
(52) U.S. Cl. .................... 428/458; 428/473.5; 528/353
(58) Field of Search .............................. 428/458, 473.5; 528/353

(56) References Cited

U.S. PATENT DOCUMENTS 5,262,227 A * 11/1993 Takabayashi et al. ........ 428/215
5,741,598 A * 4/1998 Shiotani et al. .............. 428/458
5,891,986 A * 4/1999 Yamaguchi et al. ......... 528/310

* cited by examiner

Primary Examiner—D. S. Nakarani
(74) Attorney, Agent, or Firm—Reed Smith LLP

(57) ABSTRACT

A polyimide/metal composite sheet is composed of a metal film and a polyimide film polyimide which is prepared by reaction of asymmetric biphenyltetracarboxylic acid dianhydride and 1,3-bis(4-aminophenoxy)benzene. The polyimide film is firmly bonded to and hardly peelable from the metal film. The polyimide film can contain a solid filler.

4 Claims, 1 Drawing Sheet

POLYIMIDE/METAL COMPOSITE SHEET

This is a continuation of application Ser. No. 09/021,074 filed Feb. 9, 1998 now abandoned which is a Continuation-in Part of application of Ser. No. 08/690,107 filed Jul. 31, 1996, now U.S. Pat. No. 5,741,598 which claims the priority of Japanese Application Nos. 7-196537, filed Aug. 1, 1995; 7-196538, filed Aug. 1, 1995; 8-138551, filed May 31, 1996; 9-078572, filed Mar. 28, 1997, the content of which is hereby incorporated by reference.

FIELD OF THE INVENTION

The present invention relates to an aromatic polyimide/metal composite sheet and an aromatic polyimide film.

BACKGROUND OF THE INVENTION

An aromatic polyimide sheet has a high rigidity, a high heat-resistance, and a low linear expansion coefficient, and therefore it has been employed for a wide variety of industrial devices such as electronic devices for incorporation into cameras, personal computers, and liquid crystal displays. In these devices, the polyimide sheets are generally used as substrates of flexible circuit-printing boards (for flexible electric circuits, FEC) and substrates for tape automated bonding. The polyimide substrate is used in the form of a composite of an aromatic polyimide sheet (or film) and a metal film (e.g., copper film) combined by an adhesive such as an epoxy adhesive. Most of such known adhesives are somewhat heat resistant, but less heat resistant than the aromatic polyimide. Therefore, these relatively poor heat resistant adhesives give adverse effect to the polyimide/metal composites in their heat resistance.

Therefore, there have been proposed a number of methods for preparing a heat resistant polyimide/metal composite which does not use an adhesive. For instance, a metal is electrically plated on a polyimide film. Also known is a process comprising coating a polyamide acid solution on a metal film (or foil) and heating the coated polyamide acid layer so as to dry and imidize the coated polyamide acid. Further known is a method of pressing a thermoplastic polyimide film onto a metal foil under heating.

U.S. Pat. No. 4,543,295 discloses high temperature polyimide film laminates in which a polyimide film and a metal film are bonded by means of a polyimide adhesive. The polyimide adhesives described therein are Larc-2, -3, and -4 which are a reaction product of BTDA (3,3',4,4'-benzophenone tetracarboxylic acid dianhydride) and 3,3'-DABP (3,3'-diaminobenzophenone), a reaction product of 2 BTDA/1 PMDA (pyromellitic acid dianhydride) and 3,3'-DABP, and a reaction product of 3 BTDA/1 PMDA and 4,4'-DABP (4,4'-diaminobenzophenone), respectively.

U.S. Pat. No. 5,262,227 describes an aromatic polyimide/metal composite sheet which is produced by pressing a metal foil (or film) onto a polyimide composite sheet composed of plural polyimide films under heating.

SUMMARY OF THE INVENTION

It is a main object of the present invention to provide a new polyimide/metal composite which shows a high heat resistant and a high bonding strength between the polyimide film and the metal film.

It is another object of the invention to provide a new polyimide/metal composite which shows a high heat resistance and a high bonding strength between the polyimide film and the metal film and which can be produced under relatively mild conditions.

It is a further object of the invention to provide a new polyimide film which is favorably employable for preparing a heat resistant polyimide/metal composite by combining them with heating under pressure.

It is a still further object of the invention to provide a new polyimide film which has a high heat conductivity and is favorably employable for preparing a heat resistant polyimide/metal composite by combining them with heating under pressure.

There is provided by the invention a polyimide/metal composite sheet comprising a metal film and a polyimide film bonded to the metal film, wherein the polyimide film comprises a polyimide having a recurring unit of the following formula (1):

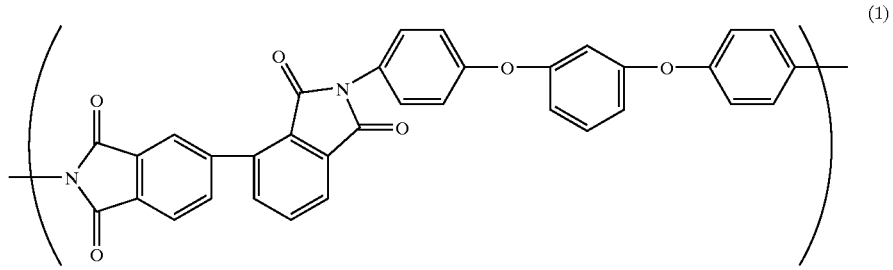

(1)

There is further provided by the invention a polyimide/metal composite sheet comprising a metal film and a polyimide film bonded to the metal film, wherein the polyimide film comprises 5 to 50 weight % of a polyimide having a recurring unit of the above-mentioned formula (1) and 95 to 50 weight % of a solid filler.

DETAILED DESCRIPTION OF THE INVENTION

Figure 1:
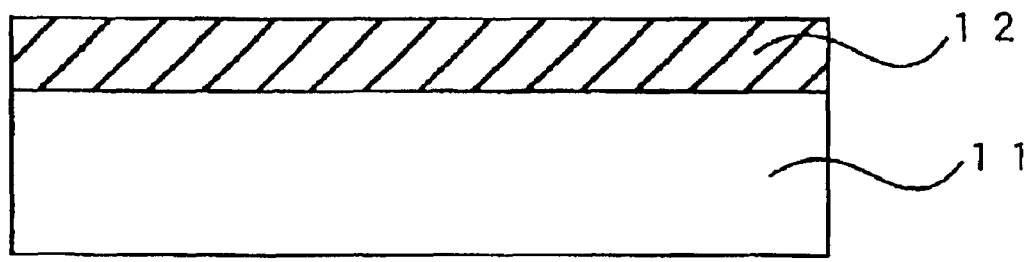
FIG. 1 is a schematic section of a representative metal/polyimide composite sheet of the invention.

As is illustrated in FIG. 1, the metal/polyimide composite sheet of the invention comprises a polyimide film 11 and a metal foil (or film) 12 arranged on the polyimide film 11. The metal foil 12 is combined to the polyimide film 11 firmly such as at a peel strength of 1.0 kgf/cm or more (measured according to 90° peel defined in IPC-TM-(2.4.9)).

Figure 2:
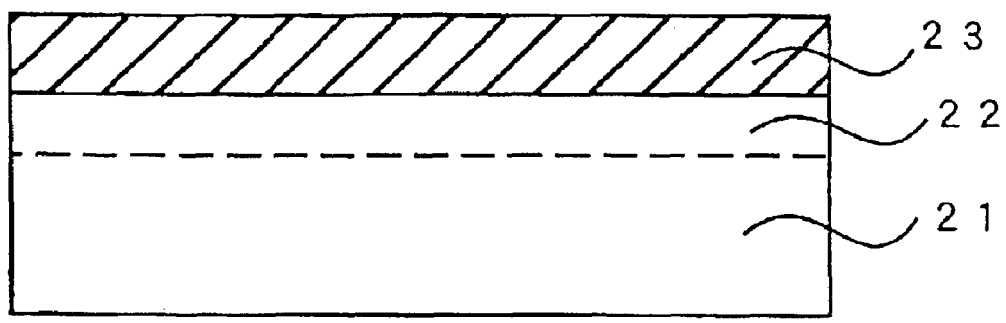
FIG. 2 is a schematic section of another representative metal/polyimide composite sheet of the invention.

In FIG. 2, the metal/polyimide composite sheet of the invention comprises a polyimide substrate film 21, a thin polyimide coat or film 22 arranged on the substrate film 21, and a metal foil 23 arranged on the polyimide coat or film 22. In the metal/polyimide composite sheet, the thin polyimide coat or film 22 is united to the substrate film 21 so that the polyimide coat or film 22 cannot be separated from the substrate film 21 without its breakage. The metal foil 23 is combined to the polyimide coat or film 22 firmly such as at a peel strength of 1.0 kgf/cm or more (measured according to 90° peel defined in IPC-TM-(2.4.9)).

The polyimide film of the invention can be prepared by the following process.

The polyimide of the polyimide film comprises a recurring unit of the aforementioned formula (1) and is produced from a polyamide acid (or polyamic acid) having been prepared by reaction of 2,3,3',4'-biphenyltetracarboxylic acid dianhydride (which may be hereinafter referred to as "a-BPDA": "a" standing for "asymmetric") and 1,3-bis(4-aminophenoxy)benzene (which may be hereinafter referred to as "TPE-R").

The reaction for the preparation of the polyamide acid can be performed by reacting a-BPDA and TPE-R in an essentially equimolar amount in an appropriate organic solvent. A portion (up to 20 molar %, preferably up to 10 molar %) of a-BPDA can be replaced with other aromatic tetracarboxylic acids or their derivatives (e.g., pyromellitic acid dianhydride, 3,3',4,4'-benzophenonetetracarboxylic acid dianhydride, 3,3',4,4'-biphenyltetracarboxylic acid dianhydride, 2,2-bis(3,4-dicarboxyphenyl)propane dianhydride, bis(3,4-dicarboxyphenyl)ether dianhydride, bis(3,4-dicarboxyphenyl)sulfone dianhydride, 2,3,6,7-naphthalenetetracarboxylic acid dianhydride) under the condition that such replacement does not essentially lower the characteristics of the resulting polyimide. Also, a portion (up to 20 molar %, preferably up to 10 molar %) of TPE-R can be replaced with other aromatic amines (e.g., aromatic diamines having plural benzene rings in its molecular structure such as 4,4'-diaminodiphenyl ether, 4,4'-diaminodiphenylsulfide, 4,4'-diaminobenzophenone, 4,4'-diaminodiphenylmethane, 2,2-bis(4-aminophenyl)propane, 1,4-bis(4-aminophenoxy)benzene, 4,4'-bis(4-aminophenyl) diphenyl ether, 4,4'-bis(4-aminophenyl)diphenylsulfone, 4,4'-bis(4-aminophenyl)-diphenylsulfide, 4,4'-bis(4-aminophenyl)diphenylmethane, 4,4'-(bis(4-aminophenoxy) diphenyl ether, 4,4'-bis(4-aminophenoxy)diphenylsulfone, 4,4'-bis(4-aminophenoxy)diphenylsulfide, 4,4'-bis(4-aminophenoxy)diphenylmethane, 2,2-bis[4-(4-aminophenoxy)phenyl]propane, and 2,2-bis[4-(4-aminophenoxy)phenyl]hexafluoropropane; aliphatic diamines such as 1,4-diaminobutane, 1,6-diaminohexane, 1,8-diaminooctane, 1,10-diaminodecane, and 1,12-diaminododecane; and xylylene diamine) under the condition that such replacement does not essentially lower the characteristics of the resulting polyimide.

The polyamide acid for the preparation of the polyimide film may have a tetracarboxylic acid residue as its terminal group. Otherwise, the terminal group may be a dicarboxylic acid residue which is attached to an amine terminal group. The dicarboxylic acid residue can be introduced by using a dicarboxylic acid anhydride such as phthalic acid anhydride and its derivatives, hexahydrophathalic acid anhydride and its derivatives, and succinic acid anhydride and its derivatives. Phthalic acid anhydride is preferred.

The polyamide acid solution for preparing the polyimide film can contain a solid filler for increasing the heat conductivity of the resulting polyimide film. The resulting polyimide can be placed between two metal films and serves as an electric insulating film. Examples of the fillers include a crystalline silica powder, a silicon nitride powder, an aluminum nitride powder, a boron nitride powder, an alumina powder, a magnesium oxide powder, and a silicon carbide powder. The fillers can be employed singly or in combination.

The polyimide and the solid filler are preferably employed at in amounts of 5 to 50 wt. % (polyimide) and 95 to 50 wt. % (filler). The polyimide of 10 to 45 wt. % and the filler of 90 to 55 wt. % are more preferred.

The reaction between the diamine compound (TPE-R and, optionally, other diamines) and the aromatic tetracarboxylic acid compound (a-BPDA and, optionally, other carboxylic acids or its derivatives, and dicarboxylic acid anhydride) can be performed in an essentially equimolar amount, preferably in an molar ratio (in terms of diamine/carboxylic acid(s)) of 0.92 to 1.0, more preferably 0.98 to 1.0, most preferably 0.99 to 1.0. The dicarboxylic acid anhydride may be employed in an amount of not more than 0.05 mole, preferably 0.0001 to 0.02 mole, per 1 mole of the tetracarboxylic acid dianhydride.

Examples of the organic solvents employable for the preparation of the polyamide acid include N-methyl-2-pyrrolidone, N,N-dimethylformamide, N,N-dimethylacetamide, N,N-diethylacetamide, dimethylsulfoxide, hexamethylphosphoramide, N-methylcaprolactam, and cresols. The solvents can be employed singly or in combination.

The reaction solution may contain a phosphorus-containing stabilizer such as triphenyl phosphite or triphenyl phosphate for keeping the reaction solution from gelation.

The reaction for the preparation of the polyamide acid can be performed in the organic solvent at a temperature of not higher than approximately 100° C., preferably at a temperature of 20 to 60° C. In the resulting reaction solution, a small amount of polyimide may be produced. The resulting reaction solution containing a polyamide acid can be employed per se as a dope solution of the preparation of the polyimide film.

The dope solution for the polyimide film is spread on a temporary support plate such as a glass plate, a stainless sheet, or a belt of stainless sheet or other material, and heated at 100 to 250° C. to dry the spread solution or to cure partially the polyamide acid in the spread solution layer. The polyimide film also can be produced by heating the polyamide acid solution at a temperature of not higher than 150° C., specifically 15 to 50° C., in the presence of a chemical imidizing agent.

The self-supporting polyamide acid film (or a film of a mixture of polyamide acid and polyimide) was then heated to a temperature which is higher than the glass transition point (Tg) of the polyimide of the polyimide film but is lower than the temperature at which the polyimide begins to deteriorate. The temperature preferably is in the range of 270 to 350° C. (temperature of the film surface measured by a surface thermometer). The heating is preferably continued for 1 to 60 minutes so that the imidization (or imidation) of the polyamide acid film can be almost complete.

The polyimide/polyimide composite sheet of the invention can be prepared by the following process.

The polyimide/polyimide composite sheet comprises a polyimide substrate film and a polyimide coat film which is provided on the substrate film.

The polyimide of the polyimide substrate film can be produced from a polyamide acid (or polyamic acid) having been prepared by reaction of 3,4,3',4'-biphenyltetracarboxylic acid dianhydride (which may be hereinafter referred to as "s-BPDA": "s" standing for "symmetric") and p-phenylenediamine (which may be hereinafter referred to as "PPD"). The p-phenylenediamine can be employed in combination with 4,4'-diaminodiphenyl ether (which may be referred to as "DADE") under the condition that the molar ratio of PPD/DADE is in the range of 100/0 to 70/30. The polyamide acid of s-BPDA and PPD/DADE can be prepared from s-BPDA and a mixture of PPD and DADE. Otherwise, a polyamide acid of s-BPDA/PPD and a polyamide acid of s-BPDA/DADE are independently prepared and then both polyamide acids are combined.

The polyimide substrate prepared from the above-mentioned polyamide acid shows a high heat resistance, no noticeable glass transition point, a high mechanical strength, and an excellent electrical property.

The reaction for the preparation of the polyamide acid can be performed by reacting s-BPDA and PPD (or PPD/DADE) in an essentially equimolar amount in an appropriate organic solvent. A portion (up to 40 molar %) of s-BPDA can be replaced with other aromatic tetracarboxylic acid or its derivative (e.g., pyromellitic acid dianhydride) under the condition that such replacement does not essentially lower the characteristics of the resulting polyimide. Also, a portion (up to 40 molar %) of PPD (or PPD/DADE) can be replaced with other aromatic amine (e.g., 4,4'-diaminodiphenylmethane) under the condition that such replacement does not essentially lower the characteristics of the resulting polyimide.

The polyimide substrate prepared from the above-mentioned polyamide acid shows a glass transition point at a high temperature generally in the range of 200 to 300° C., high heat resistance, a high mechanical strength, and an excellent electrical property.

The polyimide of the polyimide coat film comprises a recurring unit of the aforementioned formula (1) and is produced from a polyamide acid (or polyamic acid) having been prepared by reaction of 2,3,3',4'-biphenyltetracarboxylic acid dianhydride (a-BPDA) and 1,3-bis(4-amino-phenoxy)benzene (TPE-R).

The reaction for the preparation of the polyamide acid can be performed in the aforementioned manner.

The polyimide/polyimide composite sheet can be prepared using a dope solution for the polyimide substrate film and a dope solution for the polyimide coat film.

The dope solution for the substrate film is spread on a temporary support plate such as a glass plate, a stainless sheet, or a belt of stainless sheet or other material, and heated at 100 to 200° C. to dry the spread solution or to cure partially the polyamide acid in the spread solution layer. Therefore, the heated solution layer comprises the polyamide acid alone or a mixture of the polyamide acid and the resulting polyimide, and is in the form of a self-supporting film. The film may partially be in the form of gel.

On thus prepared film, the dope solution for the preparation of polyimide coat film is coated. This dope solution can be the polyamide acid solution. Otherwise, the dope solution may be a polyimide solution which is formed by heating the polyamide acid solution at 150 to 250° C. The polyimide solution also can be produced by heating the polyamide acid solution at a temperature of not higher than 150° C., specifically 15 to 50° C., in the presence of a chemical imidizing agent.

The self-supporting polyamide acid film (or a film of a mixture of polyamide acid and polyimide) for the substrate film coated with the polyamide acid solution (or a polyimide solution, or a polyamide acid-polyimide solution) was then heated to a temperature which is higher than the glass transition point (Tg) of the polyimide of the polyimide coat but is lower than the temperature at which the polyimide begins to deteriorate. The temperature preferably is in the range of 270 to 350° C. (temperature of the film surface measured by a surface thermometer). The heating is preferably continued for 1 to 60 minutes so that the imidization of the substrate film and the coated layer can be almost complete. The polyimide/polyimide composite sheet is thus obtained.

The polyimide/polyimide composite sheet can be produced by the co-extrusion process which is described in U.S. Pat. No. 5,262,227. In the co-extrusion process, the dope solutions are extruded in the form of a solution film simultaneously from dies (i.e., extruder dies) arranged in parallel, and the extruded dope solution films are combined after the dope solution films are partially or wholly dried. The combined films are then heated for completing the imidization.

The polyimide coat film can be arranged on one surface of the substrate film as described above. The polyimide coat film also can be arranged on the substrate film on both surface sides. Such three layer composite sheet can be produced in the manner as described in U.S. Pat. No. 5,262,227.

In the polyimide/polyimide composite sheet, the polyimide substrate film preferably has a thickness in the range of 15 to 150 $\mu$m, and the polyimide coat preferably has a thickness in the range of 2 to 10 $\mu$m. In the composite sheet, the thickness of the substrate film preferably is 70% or more.

The polyimide substrate film and the polyimide coat film of the polyimide/polyimide composite sheet of the invention are bonded to each other very firmly. Therefore, it is not possible to separate the polyimide coat film from the polyimide substrate film without breakage of the coat film.

The metal/polyimide composite sheet of the invention can be produced by fixing a metal film (or metal foil) onto the polyimide film or the polyimide coat film of the polyimide/polyimide composite sheet by a hot melt method. The hot melt can be performed, preferably under the conditions of a temperature of 280 to 330° C., a pressure of 1 to 100 kgf/cm$^2$, and a period of 1 sec. to 30 min. For the hot melt, a heat roll can be employed.

The metal film can be made of copper, aluminum, gold, stainless steel, or metal alloy. Copper film such as milled copper foil or electrolytic copper foil is preferred. The metal film preferably has a thickness of 10 to 60 $\mu$m.

The metal film can be placed on both sides of the polyimide film. If the polyimide substrate film has the polyimide coat film on both sides, a metal film can be fixed onto both polyimide coat film.

The preferred embodiments of the present invention are is further described by the following examples.

(1) Preparation of Dope Solution X-1 for Substrate Film

In a 300 mL-volume glass vessel equipped with a stirrer, a nitrogen-gas inlet, and a refluxing condenser, 160 g of N-methyl-2-pyrrolidone was placed. The N-methyl-2-pyrrolidone was stirred, and to this was added 10.81 g (0.1000 mole) of p-phenylenediamine (PPD) in a stream of nitrogen. The resulting mixture was kept at 50° C. to give a homogeneous solution. To the solution was slowly and carefully added 29.258 g (0.09945 mole) of 3,3',4,4'-biphenyltetracarboxylic acid dianhydride (s-BPDA) without noticeable heat production. After the addition was complete, the mixture was kept at 50° C. for 3 hours to perform the reaction for formation of polyamide acid. The resulting polyamide acid solution was a viscous brown liquid showing approx. 3,000 poise at 25° C. Thus, the desired polyamide acid-dope solution X-1 for substrate film was obtained.

(2) Preparation of Dope Solution X-2 for Substrate Film

In a 300 mL-volume glass vessel equipped with a stirrer, a nitrogen-gas inlet, and a refluxing condenser, 166 g of N,N-dimethylacetamide (DMAc) was placed. The DMAc was stirred, and to this were added 9.192 g (0.08500 mole) of p-phenylenediamine (PPD) and 3.003 g (0.01500 mole) of 4,4'-diaminodiphenyl ether (DADE) in a stream of nitrogen. The resulting mixture was kept at 50° C. to give a homogeneous solution. To the solution was slowly and carefully added 29.258 g (0.09945 mole) of 3,3',4,4'-biphenyltetracarboxylic acid dianhydride (s-BPDA) without noticeable heat production. After the addition was complete, the mixture was kept at 50° C. for 3 hours to perform the reaction for formation of polyamide acid. The resulting polyamide acid solution was a viscous brown liquid showing approx. 3,000 poise at 25° C. Thus, the desired polyamide acid-dope solution X-2 for substrate film was obtained.

(3) Preparation of Dope Solution Y-1 for Polyimide Coat

In a 500 mL-volume glass vessel equipped with a stirrer, a nitrogen-gas inlet, and a refluxing condenser having fractionating column, 195 g of N-methyl-2-pyrrolidone was placed. The N-methyl-2-pyrrolidone was stirred, and to this were added 29.234 g (0.1000 mole) of 1,3-bis(4-aminophenoxy)benzene (TPE-R) and 59 g of triphenyl phosphate in a stream of nitrogen. The resulting mixture was kept at 25° C. to give a homogeneous solution. To the solution were slowly and carefully added 29.273 g (0.0995 mole) of 2,3,3',4'-biphenyltetracarboxylic acid dianhydride (a-BPDA) and 0.1481 g (0.001000 mole) of phthalic acid anhydride without noticeable heat production. After the addition was complete, the mixture was kept at 25° C. for one hour to perform the reaction for formation of polyamide acid. To the resulting polyamide acid solution was added 20 mL of toluene, and then the resulting solution was heated to 190° C. The solution was heated to that temperature for 5 hours, while distilling water produced in the solution together with toluene off. Thus, a viscous yellowish red liquid showing approx. 500 poise at 25° C., which was the desired polyimide-dope solution Y-1 for polyimide coat, was obtained.

(4) Preparation of Dope Solution Y-2 for Polyimide Coat

In a 500 mL-volume glass vessel equipped with a stirrer, a nitrogen-gas inlet, and a refluxing condenser having fractionating column, 235 g of N,N-dimethylacetamide was placed. The N,N-dimethylacetamide was stirred, and to this were added 29.234 g (0.1000 mole) of 1,3-bis(4-aminophenoxy)benzene (TPE-R) and 59 g of triphenyl phosphate in a stream of nitrogen. The resulting mixture was kept at 25° C. to give a homogeneous solution. To the solution were slowly and carefully added 29.273 g (0.0995 mole) of 2,3,3',4'-biphenyltetracarboxylic acid dianhydride (a-BPDA) and 0.1481 g (0.001000 mole) of phthalic acid anhydride without noticeable heat production. After the addition was complete, the mixture was kept at 25° C. for 5 hours to perform the reaction for formation of polyamide acid. Thus, a viscous pale yellowish brown liquid showing approx. 2,000 poise at 25° C., which was the desired polyamide acid-dope solution Y-2 for the polyimide coat, was obtained.

(5) Preparation of Dope Solution Y-3 for Polyimide Coat

In a 500 mL-volume glass vessel equipped with a stirrer, a nitrogen-gas inlet, and a refluxing condenser having fractionating column, 269 g of N,N-dimethylacetamide was placed. The N,N-dimethylacetamide was stirred, and to this were added 29.234 g (0.1000 mole) of 1,3-bis(4-aminophenoxy)benzene (TPE-R) and 59 g of triphenyl phosphate in a stream of nitrogen. The resulting mixture was kept at 25° C. to give a homogeneous solution. To the solution was slowly and carefully added 29.71 g (0.101 mole) of 2,3,3',4'-biphenyltetracarboxylic acid dianhydride (a-BPDA) without noticeable heat production. After the addition was complete, the mixture was kept at 25° C. for 4 hours to perform the reaction for formation of polyamide acid. Thus, a viscous pale clear brown liquid showing approx. 2,000 poise at 25° C., which was the desired polyamide acid-dope solution Y-3 for the polyimide coat, was obtained.

EXAMPLE 1

The dope solution X-1 was coated on a glass plate by means of an applicator, and the coated layer was dried at 120° C. for 15 minutes. On the dry layer was coated the dope solution Y-1 using an applicator. The coated dope solution was dried at 120° C. for 15 minutes. The dried coat layer film had a thickness of 6.5 μm.

The two layer film was cooled, and separated from the glass plate. The separated film was fixed within a metal frame, and heated to 200° C. for 30 minutes and then 300° C. for 30 minutes to produce a polyimide/polyimide composite sheet (total thickness: 30 μm, 25 μm for polyimide substrate film from Dope solution X-1 and 5 μm for polyimide coat from Dope solution Y-1).

On the polyimide coat of the composite sheet was placed an electrolytic copper foil (thickness: 35 μm), and the foil was pressed on the polyimide coat using a hot press (kept at 300° C.). The hot press procedure was performed at 30 kgf/cm$^2$ for 1 minute after pre-heating for 5 minutes. Thus, a composite sheet of copper foil and two layer polyimide film which showed almost no curling was obtained.

The copper/polyimide composite sheet was examined in its 90° peel (peeling) strength, 90° peel strength after the copper foil was etched out to give a 1 mm line & space pattern, and appearance and 90° peel strength after the composite sheet was immersed in a solder bath at 280° C. for one minute. The results of the examination are set forth in Table 1. The separation was observed only at the interface between the copper foil and the polyimide coat in every test.

EXAMPLES 2 TO 6

The procedures of Example 1 were repeated except for using the combination of the dope solutions set forth in Table 1, to give a copper/polyimide composite sheet. The obtained composite sheet of copper foil and two layer polyimide film showed almost no curling.

The 90° peel strength and other characteristics of the copper/polyimide composite sheet obtained as above was examined in the same manner as in Example 1. The results of the examination are set forth in Table 1. The separation was observed only at the interface between the copper foil and the polyimide coat in every test for every composite sheet.

TABLE 1

| Example No. | Dope Solutions (Tg, ° C.) | 90° Peel Strength (kgf/cm) | | | Appearance After Soldering |
|---|---|---|---|---|---|
| | | Untreated | After Etching | After Soldering | |
| 1 | X-1 Y-1 (*) (250) | 2.1 | 2.1 | 2.0 | Good |
| 2 | X-1 Y-2 (*) (250) | 2.0 | 2.0 | 1.9 | Good |
| 3 | X-2 Y-1 (*) (250) | 2.1 | 2.1 | 2.0 | Good |
| 4 | X-2 Y-2 (*) (250) | 1.9 | 1.9 | 1.9 | Good |
| 5 | X-1 Y-3 (*) (250) | 2.1 | 2.1 | 2.0 | Good |
| 6 | X-2 Y-3 (*) (250) | 2.0 | 2.0 | 2.0 | Good |

Remark:
(*): No glass transition point was observed at temperatures between room temperature (25° C.) and 350° C.

Comparison Example 1

The dope solution Y-2 was coated on a commercially available aromatic polyimide film (Upilex-S, thickness 25 μm, available from Ube Industries, Ltd.) using an applicator. The coated solution was heated successively at 120° C. for 15 minutes, at 200° C. for 30 minutes, and at 300° C. for 30 minutes. The resulting coat had a thickness of 5 μm, and the obtained polyimide/polyimide composite sheet had a thickness of 30 μm.

The procedures of Example 1 were repeated except for using the above-obtained polyimide/polyimide composite sheet, to give a copper/polyimide composite sheet. The obtained composite sheet of copper foil and two layer polyimide film showed almost no curling.

The 90° peel strength of the untreated copper/polyimide composite sheet was examined in the same manner as in Example 1. The 90° C. peel strength was as low as 0.5 kgf/cm. The separation was observed at the interface between the polyimide substrate (Upilex-S) and the polyimide coat.

EXAMPLE 7

The dope solution Y-1 was coated on a glass plate by means of an applicator, and the coated layer was dried at 120° C. for 15 minutes. On the dry layer was coated the dope solution X-1 using an applicator. The coated dope solution was dried at 120° C. for 15 minutes. On the dry coated layer of the dope solution X-1 was further coated the dope solution Y-1, and the coated layer was dried at 120° C. for 15 minutes.

Thus produced three layer film (Y-1/X-1/Y-1) was cooled, and separated from the glass plate. The separated film was fixed within a metal frame, and heated to 200° C. for 30 minutes and then 300° C. for 30 minutes to produce a polyimide/polyimide/polyimide composite sheet (5 $\mu$m/25 $\mu$m/5 $\mu$m).

On each the both polyimide coats of the composite sheet was placed an electrolytic copper foil (thickness: 35 $\mu$m), and the foil was pressed on the polyimide coat using a hot press in the same manner as in Example 1. A composite sheet of copper foil/three layer polyimide film/copper foil showing almost no curling was obtained.

The 90° peel strength and other characteristics of the copper/polyimide/copper composite sheet obtained as above was examined in the same manner as in Example 1. The results of the examination are set forth in Table 2. The separation was observed only at the interface between the copper foil and the polyimide coat in every test for every composite sheet.

EXAMPLES 8 TO 12

The procedures of Example 7 were repeated except for using the combination of the dope solutions set forth in Table 2, to give a copper/polyimide/copper composite sheet. The obtained composite sheet of copper/polyimide/copper sheet showed almost no curling.

The 90° peel strength and other characteristics of the copper/polyimide composite sheet obtained as above was examined in the same manner as in Example 1. The results of the examination are set forth in Table 2. The separation was observed only at the interface between the copper foil and the polyimide coat in every test for every composite sheet.

TABLE 2

| Example No. | Dope Solutions | 90° Peel Strength (kgf/cm) | | | Appearance |
| | | Untreated | After Etching | After Soldering | After Soldering |
|---|---|---|---|---|---|
| 7 | Y-1/X-1/Y-1 | 2.1 | 2.1 | 2.0 | Good |
| 8 | Y-2/X-1/Y-2 | 2.0 | 2.0 | 1.9 | Good |
| 9 | Y-1/X-2/Y-1 | 2.1 | 2.1 | 2.0 | Good |
| 10 | Y-2/X-2/Y-2 | 1.9 | 1.9 | 1.9 | Good |
| 11 | Y-3/X-1/Y-3 | 2.1 | 2.1 | 2.0 | Good |
| 12 | Y-3/X-2/Y-3 | 2.0 | 2.0 | 2.0 | Good |

EXAMPLE 13

In the same manner as in the Preparation procedure (2), a polyamide acid solution for substrate film was prepared in DMAc from a combination of s-BPDA and PPD/DADE (85/15, molar ratio). The obtained dope solution (X-3) had a polymer concentration of 18 wt. %, and a viscosity of 1,500 poise (25° C.).

In the same manner as in the Preparation procedure (4), a polyamide acid solution for polyimide coat was prepared in DMAc from a combination of a-BPDA and TPE-R. The obtained dope solution (Y-4) had a polymer concentration of 22 wt. %, and a viscosity of 1,500 poise (25° C.).

The dope solutions were extruded using a die described in U.S. Pat. No. 5,262,227 to place a three layer laminate (Y-4/X-3/Y-4) on a plain metal support sheet. The laminate was dried using an air heated to 140° C. to give a solid composite sheet. The solid sheet was separated from the support sheet, and heated in a heating furnace at temperatures elevating gradually from 200° C. to 320° C. for removal of the solvent and imidization.

On each of both surfaces of thus produced three layer polyimide composite sheet was laminated under pressure and heating an electrolytic copper foil (thickness: 35 $\mu$m) by the method using a heat roll described in U.S. Pat. No. 5,262,227. The lamination was performed at 320° C., 24 kg/cm (roll pressure) and 0.5 m/min. (lamination rate). Thus, a continuous copper/polyimide/copper composite sheet was produced.

The 90° peel strength and other characteristics of the copper/polyimide/copper composite sheet obtained as above was examined in the same manner as in Example 1. The results of the examination are as follows:

90° peel strength of the untreated sheet: 1.9 kgf/cm,

90° peel strength after etching: 1.9 kgf/cm,

90° peel strength after soldering: 1.9 kgf/cm, appearance after soldering: good

Independently, the three layer polyimide composite sheet produced in this example was examined in Pressure Cooker Test (120° C., 2 atom., 20 hours) in regard of elasticity, breaking strength, and elongation. The results are set forth in Table 3.

EXAMPLES 14 TO 16

A number of polyimide composite sheets were prepared using the dope solutions set forth in Table 3, varying the curing temperature as set forth in Table 3. On the surface of the prepared polyimide composite sheet was laminated a copper foil in the same manner as in Example 13. Thus produced copper/polyimide/copper composite sheet or copper/polyimide composite sheet was examined in its 90° C. peel strength in the same manner as in Example 1. The test results are set forth in Table 3.

Independently, the three layer polyimide composite sheet or two layer polyimide composite produced was examined in Pressure Cooker Test (120° C., 2 atom., 20 hours) in regard of elasticity, breaking strength, and elongation. The results are also set forth in Table 3.

TABLE 3

| Example No. | Dope Solutions (cure temp.) | Elasticity (kgf/mm$^2$) | Breaking Strength (kgf/mm$^2$) | Elongation (%) | 90° Peel strength (kgf/cm) |
|---|---|---|---|---|---|
| 13 | Y-4/X-3/Y-4 (320° C.) | 476/504 [507/499] | 25.5/24.6 25.7/24.7 | 39/36 37/38] | 1.9 |

TABLE 3-continued

| Example No. | Dope Solutions (cure temp.) | Elasticity (kgf/mm²) | Breaking Strength (kgf/mm²) | Elongation (%) | 90° Peel strength (kgf/cm) |
|---|---|---|---|---|---|
| 14 | Y-4/X-3/Y-4 (330° C.) | 527/519 [488/505 | 26.2/25.5 25.9/26.4 | 38/37 38/39] | 2.0 |
| 15 | Y-4/X-3/Y-4 (340° C.) | 494/505 [495/495 | 26.4/26.4 26.9/27.5 | 37/37 39/41] | 2.1 |
| 16 | Y-4/X-3 (330° C.) | 572/568 [541/558 | 29.8/29.9 27.9/29.2 | 33/34 31/33] | 1.9 |

Remarks: The values in the bracket [ ] are those determined after the composite sheet was subjected to PCT (Pressure Cooker Test).

Value in MD direction/Value in TD direction

As is clear from the above-illustrated experimental results, the metal/polyimide composite sheet has high anti-peel strength enough for the use in various industrial fields. The polyimide coat is firmly combined to the polyimide substrate film, and it is not possible to separate the polyimide coat from the separate film without breakage of the polyimide coat.

EXAMPLE 17

In a reaction vessel equipped with a stirrer, a thermometer, a nitrogen-gas inlet, and a refluxing condenser, 29.23 g (0.100 mole) of 1,3-bis(4-aminophenoxy)benzene (TPE-R), 59 g of triphenyl phosphate, and 269 g of N,N-dimethylacetamide were placed. To the mixture was potion-wise added 29.71 g (0.101 mole) of 2,3,3',4'-biphenyltetracarboxylic acid dianhydride (a-BPDA) in the stream of nitrogen gas. The reaction mixture was stirred for 4 hours at a temperature below 60° C. Thus, a viscous clear pale brown polyamide acid solution (hereinafter, referred to as Varnish A) was obtained.

Varnish A was coated on a glass plate by means of an applicator. The coated varnish was heated to 140° C. for 20 minutes, and thus dried film was peeled from the glass plate. The dry film was fixed on a stainless steel pin tenter and heated to 200° C. for 20 minutes and 300° C. for 30 minutes in air, to give a transparent yellow polyimide film of 10 μm thick.

The polyimide film was placed between two electrolytic copper foils (thickness: 35 μm). The resulting composite body was heated at 300° C. for 5 min. and pressed at 30 kgf/cm² for 20 min. by means of a hot press.

The pressed composite body showed a peel strength (90° peel) of 1.9 kgf/cm. The pressed composite body was then placed for one minute on a solder bath heated to 290° C., and the peel strength of thus treated composite was measured. The peel strength was still 1.9 kgf/cm, and no deformation was observed on the composite body.

Independently, the polyimide film was placed between an electrolytic copper foil (thickness: 35 μm) and a commercially available rigid polyimide film (Kapton, trademark of du Pont (E. I.) de Nemours & Co., thickness: 25 μm). The resulting composite body was heated and pressed in the above-mentioned manner.

The pressed composite body showed a peel strength of 1.2 kgf/cm. The peel was observed between the two polyimide films. The pressed composite body was then placed on the solder bath, and the peel strength of thus treated composite was measured. The peel strength was still 1.2 kgf/cm, and no deformation was observed on the composite body.

EXAMPLE 18

The procedure for the preparation of polyamide acid of Example 17 was repeated except for using TPE-R of 29.52 g (0.101 mol.), a-BPDA of 29.42 g (0.100 mol.), and a reaction period of one hour. To the resulting polyamide acid was added 0.296 g (0.02 mol.) of phthalic anhydride. The mixture was heated for completing the polymerization reaction to give a viscous clear pale brown polyamide acid solution.

The polyamide acid solution was processed in the same manner as in Example 17, to give a transparent yellow polyimide film.

A pressed composite body of the resulting polyimide film with two electrolytic copper foils was produced in the same manner as in Example 17. The pressed composite body showed a peel strength (90° peel) of 2.0 kgf/cm. The pressed composite body was then placed on the solder bath. The peel strength was still 2.0 kgf/cm, and no deformation was observed on the composite body.

EXAMPLE 19

The procedure for the preparation of polyamide acid of Example 18 was repeated except for replacing 269 g of N,N-dimethylacetamide with 235 g of N-methyl-2-pyrrolidone. To the resulting polyamide acid was added 0.296 g (0.02 mol.) of phthalic anhydride. The mixture was heated with 30 g of toluene, while distilling the produced water off the vessel, for completing the polymerization reaction to give a viscous clear pale yellowish brown polyamide acid solution.

The polyamide acid solution was processed in the same manner as in Example 17, to give a transparent yellow polyimide film.

A pressed composite body of the resulting polyimide film with two electrolytic copper foils was produced in the same manner as in Example 17. The pressed composite body showed a peel strength (90° peel) of 2.1 kgf/cm. The pressed composite body was then placed on the solder bath. The peel strength was still 2.1 kgf/cm, and no deformation was observed on the composite body.

EXAMPLE 20

The procedures for the preparation of polyimide film of Example 17 were repeated except for replacing 29.71 g (0.101 mol.) of a-BPDA with a combination of 23.68 g (0.081 mol.) of a-BPDA and 5.88 g (0.020 mol.) of 3,3',4,4'-biphenyltetracarboxlic acid dianhydride.

A pressed composite body of the resulting polyimide film with two electrolytic copper foils was produced in the same manner as in Example 17. The pressed composite body showed a peel strength (90° peel) of 1.4 kgf/cm. The pressed composite body was then placed on the solder bath. The peel strength was still 1.4 kgf/cm, and no deformation was observed on the composite body.

EXAMPLE 21

The procedures for the preparation of polyimide film of Example 17 were repeated except for replacing 29.23 g (0.100 mol.) of TPE-R with a combination of 26.32 g (0.090 mol.) of TPE-R and 1.16 g (0.010 mol.) of 1,6-diaminohexane.

A pressed composite body of the resulting polyimide film with two electrolytic copper foils was produced in the same manner as in Example 17. The pressed composite body showed a peel strength (90° peel) of 1.6 kgf/cm. The pressed composite body was then placed on the solder bath. The peel strength was still 1.6 kgf/cm, and no deformation was observed on the composite body.

EXAMPLE 22

In a separable flask, 200 mL of N,N-dimethylacetamide and 102.7 g of an aluminum nitride powder were placed, and the aluminum nitride powder was well dispersed in the N,N-dimethylacetamide by processing in a ultrasonic disperser for 15 minutes. To the flask was attached a stirrer. In the resulting dispersion was placed 21.929 g of 1,3-bis(4-aminophenoxy)benzene under stirring. The mixture was further stirred for 10 minutes. In the stirred mixture was placed 22.071 g of 2,3,3',4'-biphenyltetracarboxylic acid dianhydride. The reaction was carried out for 3 hours, to give a polyamide acid dope solution containing the aluminum nitride powder. In the dope solution, the content of aluminum nitride powder was 69.5 wt. %, based on the total solid content (i.e., polyamide acid and aluminum nitride powder). The polyamide acid dope solution was filtered under 5 kg/cm on a filter (pore size: 40 μm) to remove an agglomerated mass of the aluminum nitride powder. The filtered dope solution had a viscosity of 900 poise.

The dope solution was coated on an aluminum foil (thickness: 150 μm) to form a dope solution layer of 35 μm thick and heated by an air of 250° C. for imidization. Thus, an aluminum foil uniformly coated with an aluminum nitride powder-containing polyimide layer (thickness: 25 μm) was produced. The polyimide layer had no crystalline structure according to X-ray diffraction analysis.

The resulting composite body had no curling.

An electrolytic copper foil (thickness: 35 μm, manufactured by Fukuda Metal Co., Ltd.) was placed and pressed on the polyimide layer of the composite body at 320° C.

The resulting Al-polyimide-Cu composite body was subjected to the known 180° peel test (at room temperature) for determining the peel strength on the interface between the copper foil and the polyimide layer. The peel strength of 1.5 kg/cm was given.

Independently, the polyamide dope solution containing aluminum nitride powder was treated to give a polyimide film of 40 μm thick. The polyimide film was subjected to a rapid heat conductivity measuring meter (manufactured by Kyoto Electronics Industry Co., Ltd.). The measured heat conductivity was 1.8 W/m·k.

EXAMPLE 23

The procedure for preparing a polyamide acid dope solution of Example 22 was repeated except for using an aluminum nitride powder of 66 g. In the dope solution, the content of aluminum nitride powder was 60 wt. %, based on the total solid content. The polyamide acid dope solution was filtered in the same manner. The filtered dope solution had a viscosity of 800 poise.

The procedure for producing the Al-polyimide-Cu composite body was performed in the same manner as in Example 22, and the obtained Al-polyimide-Cu composite body was subjected to the known 180° peel test. The peel strength of 1.6 kg/cm was given.

The independently prepared polyimide film had a heat conductivity of 1.1 W/m·k.

EXAMPLE 24

The procedure for preparing a polyamide acid dope solution of Example 22 was repeated except for replacing 102.7 g of the aluminum nitride powder with the same amount of a silicon nitride powder. In the dope solution, the content of silicon nitride powder was 70 wt. %, based on the total solid content.

The procedure for producing the Al-polyimide-Cu composite body was performed in the same manner as in Example 22, and the obtained Al-polyimide-Cu composite body was subjected to the known 180° peel test. The peel strength of 1.2 kg/cm was given.

The independently prepared polyimide film had a heat conductivity of 1.7 W/m·k.

EXAMPLE 25

The procedure for preparing an Al-polyimide composite body of Example 22 was repeated except for replacing the aluminum foil with a stainless steel foil (SUS-304, thickness: 150 μm).

The procedure for producing the SUS-polyimide-Cu composite body was performed in the same manner as in Example 22, and the obtained SUS-polyimide-Cu composite body was subjected to the known 180° peel test. The peel strength of 1.0 kg/cm was given.

EXAMPLE 26

The procedure for preparing an Al-polyimide composite body of Example 22 was repeated except for replacing the aluminum foil with a copper foil (thickness: 500 μm).

The procedure for producing the Cu-polyimide-Cu composite body was performed in the same manner as in Example 22, and the obtained Cu-polyimide-Cu composite body was subjected to the known 180° peel test. The peel strength of 1.3 kg/cm was given.

EXAMPLE 27

The procedure for preparing a polyamide acid dope solution of Example 22 was repeated except for using an increased amount of the aluminum nitride powder. In the obtained dope solution, the content of aluminum nitride powder was 85 wt. %, based on the total solid content. The polyamide acid dope solution was filtered in the same manner.

The procedure for producing the Al-polyimide-Cu composite body was performed in the same manner as in Example 22, and the obtained Al-polyimide-Cu composite body was subjected to the known 180° peel test. The peel strength of 1.1 kg/cm was given.

The independently prepared polyimide film had a markedly high heat conductivity.

What is claimed is:

1. A composite sheet comprising a metal film and a polyimide film bonded to the metal film, wherein the polyimide film comprises 95 to 50 wt. % of a solid filler and 5 to 50 wt. % of a polyimide consisting essentially of a recurring unit of the following formula (I):

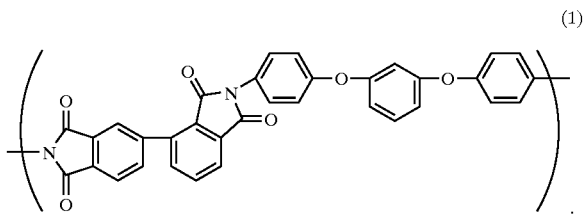

2. The composite sheet of claim 1, wherein the polyimide has a tetracarboxylic acid residue or an amine group having a dicarboxylic acid residue as its terminal.

3. The composite sheet of claim 1, wherein the polyimide film is bonded to the metal film at a peel strength of 1.0 kgf/cm or more, said peel strength being measured according to 90° peel defined in IPC-TM-(2.4.9).

4. The composite sheet of claim 1, wherein the polyimide has a tetracarboxylic acid residue or an amine group having a dicarboxylic acid residue as its terminal group.

* * * * *